United States Patent [19]
Vice

[11] Patent Number: 5,732,345
[45] Date of Patent: Mar. 24, 1998

[54] QUASI-DOUBLE BALANCED DUAL-TRANSFORMER DUAL FET MIXER, WHICH ACHIEVES BETTER ISOLATION BY USING A FIRST AND SECOND DIPLEXER, AND A TRANSMISSION LINE RF BALUN

[75] Inventor: Michael W. Vice, El Granada, Calif.

[73] Assignee: Watkins-Johnson Company, Palo Alto, Calif.

[21] Appl. No.: 575,293

[22] Filed: Dec. 20, 1995

[51] Int. Cl.⁶ .................. H04B 1/28; H04B 1/26
[52] U.S. Cl. .................. 455/333; 455/326; 455/323
[58] Field of Search .................. 455/313, 323, 455/326, 327, 332, 333; 327/113, 356; 333/25–26, 126, 129, 132, 134, 101

[56] References Cited

U.S. PATENT DOCUMENTS

| | | |
|---|---|---|
| 3,577,206 | 5/1971 | Ferrell .................. 307/240 |
| 3,700,928 | 10/1972 | Milberger et al. . |
| 4,500,847 | 2/1985 | Hallford . |
| 4,502,028 | 2/1985 | Leake . |
| 4,675,911 | 6/1987 | Sokolov et al. . |
| 4,979,233 | 12/1990 | Kawahata . |
| 5,027,163 | 6/1991 | Dobrovolny .................. 455/326 |
| 5,060,298 | 10/1991 | Waugh et al. . |
| 5,130,678 | 7/1992 | Edwards . |
| 5,280,648 | 1/1994 | Dobrovolny . |
| 5,361,409 | 11/1994 | Vice .................. 455/326 |
| 5,428,839 | 6/1995 | Friesen et al. .................. 455/326 |
| 5,428,840 | 6/1995 | Sadhir .................. 455/326 |
| 5,465,419 | 11/1995 | Zimmermann .................. 455/333 |
| 5,513,390 | 4/1996 | Vice .................. 455/323 |
| 5,551,074 | 8/1996 | Vice .................. 455/326 |

Primary Examiner—Tommy P. Chin
Assistant Examiner—David Vincent
Attorney, Agent, or Firm—R. Michael Ananian; Flehr Hohbach Test Albritton & Herbert LLP

[57] ABSTRACT

A double balanced dual-quad transformer dual field effect transistor (FET) mixer is disclosed using a first and second (FET) which have their gates electrically connected together, such that the first and second FET are connected in series. The mixer achieves improved isolation by using a first and second diplexer, and an RF and IF coupling network which comprises a flux-coupled IF transformer and a transmission line RF balun.

20 Claims, 8 Drawing Sheets

QUASI-DOUBLE BALANCED DUAL-TRANSFORMER DUAL FET MIXER, WHICH ACHIEVES BETTER ISOLATION BY USING A FIRST AND SECOND DIPLEXER, AND A TRANSMISSION LINE RF BALUN

BACKGROUND OF THE INVENTION

1. Field of the Invention

The invention relates generally to radio frequency communication devices and more specifically to passive reflection FET mixers requiting relatively low local oscillator power levels and having excellent isolation of the local oscillator signal relative to the radio and intermediate frequency signals.

2. Description of the Prior Art

The dynamic range of many prior art microwave front-ends is controlled by the single and two-tone intermodulation levels of a Schottky diode mixer. (S. Weiner, D. Neuf, S. Spohrer, "2 to 8 GHZ Double Balanced MESFET Mixer With +30 dBm Input 3rd Order Intercept," 1988 *IEEE MTT-S Digest*, pp. 1097–1099.) A typical Schottky mixer obtains third order intercept points approximately equal to the local oscillator (LO) power minus the conversion loss plus 10-dB. The diode-ring double-balanced mixer often requires the LO power to exceed the signal compression level by 6-dB. Trade-offs between LO power levels and third order intercept and one dBm compression points are inevitable, even in multiple diode schemes attempting to improve isolation, bandwidth, and single-tone intermodulation levels.

Low distortion mixing is known to be possible with small amounts of LO power when an unbiased channel of a GaAs MESFET is used as the mixing element. (See, Stephen A. Maas, "A GaAs MESFET Balanced Mixer With Very Low Intermodulation," 1987 *IEEE MTT-S Digest*, pp.895–896.) Weiner, et al., describe both single and double balanced mixers that use GaAs MESFETs instead of diodes. These mixers typically operate over a two to eight GHz range and obtain third order intercepts greater than +28 dBm at an LO power input of +23 dBm, with typical conversion loss of 8-dB, and an LO to radio frequency (RF) isolation greater than 25-dB. Weiner, et al., explain that previous designs using MESFETs had been limited by the LO balun and intermediate frequency (IF) transformer. These limitations were overcome by using a ring of GaAs MESFETs and tapered micro strip baluns in single and double balanced configurations to achieve multi-octave bandwidths. However, the bandwidth of these units is limited by the MESFET package parasitic reactances used in the ring. Weiner, et al., indicate that their future experiments will include a monolithic quad-MESFET with special gate geometry designed to improve the third order distortion, and wire-bonding of the FET to an alumina substrate to minimize parasitic reactances.

The Siliconix Si8901-DBM is a monolithic quad-MOSFET ring demodulator/mixer that is reported to achieve third-order intercepts exceeding +37 dBm and 2-dB signal overload compression and desensitization of +30 dBm at a LO drive level of +17 dBm (50 mW). (Ed Oxner, "High Dynamic Range Mixing With The Si8901," March 1988, pp. 10–11.) The Si8901 commutation-mixer relies on the switching action of the quad-MOSFET elements to effect a mixing action. The MOSFETs act, essentially, as a pair of switches reversing the phase of a signal at a rate determined by the LO frequency. The MOSFETs exhibit a finite on-resistance that is expressed as a conversion efficiency loss. The loss results from the $r_{ds(on)}$ of the MOSFETs relative to both the signal and IF impedances and signal conversion to unwanted frequencies.

SUMMARY OF THIS INVENTION

Briefly, the present invention comprises a quasi-double balanced passive reflection FET mixer that operates with reduced levels of nonlinearity and intermodulation distortion as the result of the topological structure and the application of a dc bias to FET channels used for mixing which is useful for both up- and down-frequency conversion of non-overlapping RF and IF signal frequencies. The mixer includes a pair of serially connected FET transistors pumped by a local oscillator signal that function as the signal mixing device. A pair of balanced diplexer circuits coupled between the FETs and interconnected flux-coupled IF transformer and transmission line RF balun operates to separate the RF and LO signal from the IF output signal.

The invention advantageously provides a radio frequency mixer that has a wide dynamic range of operation and low overall signal distortion including low intermodulation distortion and partial cancellation of nonlinearity distortion imposed on the radio frequency signal. These and other features and advantages of the present invention will no doubt become clear to those of ordinary skill in the art after having read the following detailed description of the preferred embodiments which are illustrated in the various drawing figures.

DETAILED DESCRIPTION OF THE PREFERRED EMBODIMENTS

Figure 1:
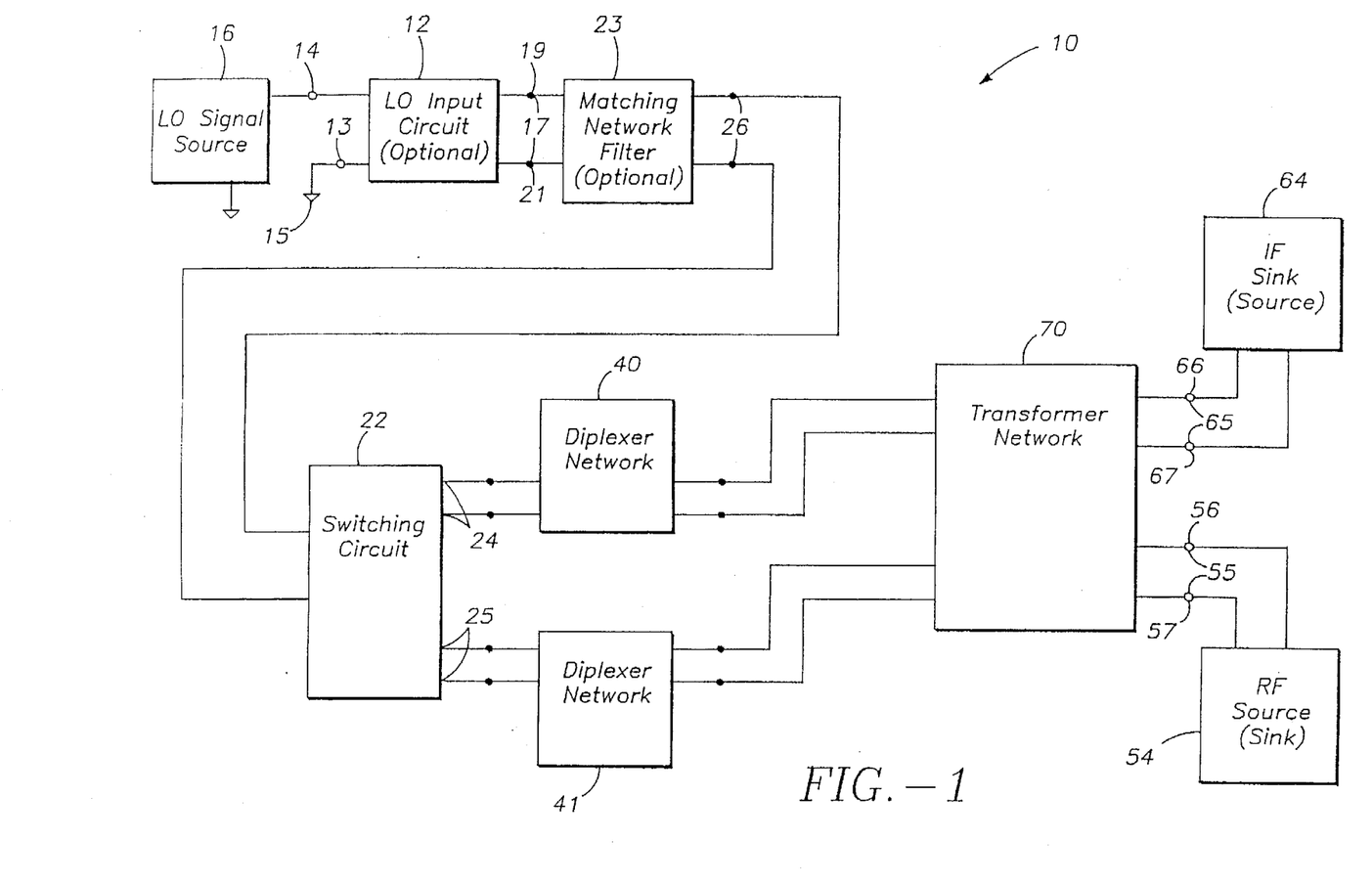
FIG. 1 is a block diagram of an embodiment of the quasi-double balanced mixer of the present invention.

In reference to FIG. 1, which shows a block diagram of an embodiment of a quasi-double balanced dual-transformer mixer 10 of the present invention, comprising an optional local oscillator (LO) input circuit 12 having a two terminal input port 13 including pin terminal 14 and ground terminal 15 for coupling to an external Local oscillator (LO) signal source 16 to the LO input circuit 12, and a two terminal output port 17 including pin terminal 19 and ground terminal 21 for coupling to switching circuit 22. The LO input circuit 12 may include a matching network 23 for filtering the LO signal and providing dc isolation of the LO input circuit from the switching circuit, or a separate input filter 23 may optionally be provided and coupled between the input circuit 12 and the switching circuit 22. The externally generated local oscillator signal is nominally a sinusoid at the desired local oscillator frequency.

An external RF source (or sink) 54 may be coupled to mixer 10 via a two terminal RF port 55 having a pin terminal 56 and a ground terminal 57, and an external IF load 11 or sink (or source) 64 may be coupled to mixer 11 via two terminal IF port 65 having a pin terminal 66 and a ground terminal 67. Each of the RF source (or sink) and IF sink (or source) are coupled to the switching circuit 22 via balanced diplexer circuits 40, 41 and transformer network 70.

Switching circuit 22 has a two terminal input port 26 having a pin terminal and a ground terminal, and first and second two-terminal switching circuit input/output ports 24, 25. The term input/output is applied to the ports because signals propagate to and from both ports as described hereinafter. Switching circuit 22 responds (turns on and off) at the LO signal frequency causing a rapid time-varying change in switching circuit resistance thereby providing the signal mixing function.

Diplexer circuits 40, 41 function to filter and separate the IF signals from the RF signals during either up-frequency conversion in which an IF signal is applied to the mixer and an RF signal is extracted from the mixer or down-frequency conversion in which an RF signal is applied and the IF signal is extracted. Transformer network 70 functions to prevent LO signals from appearing at the RF and IF ports.

Figure 2:
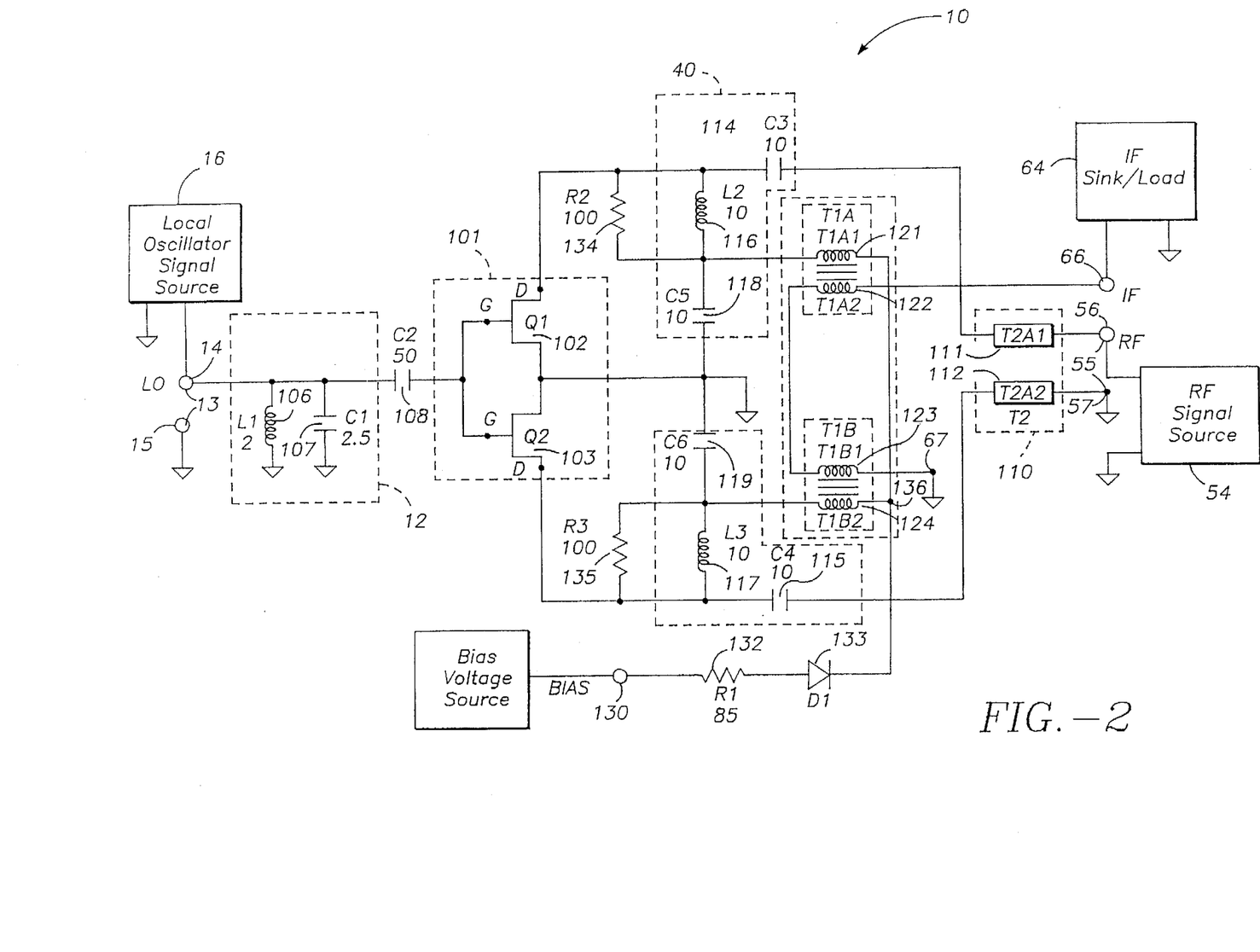
FIG. 2 is a schematic diagram of a preferred embodiment of the quasi-double balanced mixer of the present invention.

In reference to FIG. 2, which shows an illustration of a preferred embodiment of the quasi-double balanced mixer illustrated in block diagram form in FIG. 1. In this embodiment of the invention, switching device 22 is realized using a pair of interconnected field-effect transistors (FETs) 101 (Q1 102 and Q2 103) each having a control or gate (G) terminal, as well as drain (D) and source (S) terminals. The source terminal of Q1 102 is connected to the source terminal of Q2 103 which is also connected to circuit node 104 at ground potential.

In general, signal propagation through a FET junction has a perturbing effect on FET admittance (and resistance) which results in FET output signal distortion, particularly signal intermodulation distortion when the FET is used as a signal mixing means, therefore reducing the admittance perturbing effect reduces distortion and improves overall mixer performance. In the present invention, implementing the signal switching function with a FET-pair rather than with a single FET reduces the perturbing effect as described hereinafter.

Intermodulation distortion is significantly reduced by the application of dc bias to the channels of the mixing FETs. A bias voltage (5 volt) is applied to the bias port 130 and processed through the bias circuit 131 comprising and resistors R1 132, R2 134, and R3 135 and optionally diode D1 133 which provides reverse bias protection. Resistor R1 133 provides current limiting while resistors R2 134 and R3 135 provide the bias source with the proper impedance (about 100 ohms) for each FET. The bias voltage is fed to the center tap (node 136) of balun T1 136, which in turn supplies current to the FET-pair drains through resistors R2 134 and R3 135.

Figure 3:
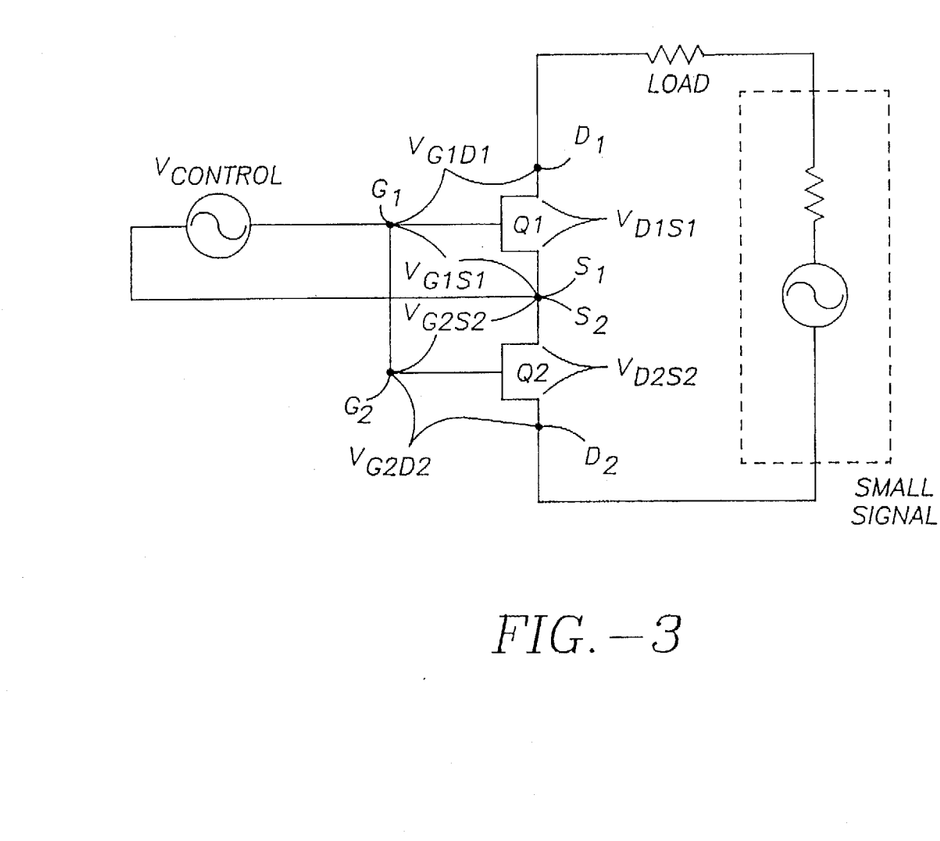
FIG. 3 is a schematic of a pair of back-to-back FETs used as a model to explain how the present invention reduces intermodulation distortion in the preferred embodiment.

The serially connected FET-pair structure and application of drain bias to the channels of the FET transistors provide structure and method for significantly reducing the intermodulation distortion in the mixer output signal. FIG. 3 is a simplified circuit which illustrates how the pair of back-to-back FETs (Q1-Q2) helps cancel intermodulation distortion.

The manner in which the FET pair reduces distortion is now described with reference to FIG. 3, which shows a pair of serially connected FETs. The gate-to-source voltage ($V_{GS}$) is equal to the sum of the gate-to-drain voltage ($V_{GD}$) and the drain-to-source voltage ($V_{DS}$).

$$V_{GS} = V_{GD} + V_{DS}$$

Let $V_{GS}$ be fixed, set by a fixed voltage source for example, then:

$$0 = \Delta V_{GD} + \Delta V_{DS}$$
$$\Delta R_{DS} \simeq C \Delta V_{GD}, \text{ where } C \text{ is a constant.}$$
$$\simeq -C \Delta V_{DS}$$

The change in resistance between the two FET drains ($\Delta R_{D1D2}$) is equal to the change of resistance between the source and drain of the first FET Q1 ($\Delta R_{D1S1}$) and the change of resistance between the source and drain of the second FET Q2 ($\Delta R_{D2S2}$).

$$\Delta R_{D1D2} = \Delta R_{D1S1} + \Delta R_{D2S2},$$
$$= -C(\Delta V_{D1S1} + \Delta V_{D2S2})$$

To a first approximation, the voltage $V_{D1D2}$ is symmetrically dropped across both FETS Q1 and Q2, so that:

$$V_{D1S1} = -V_{D2S2} \text{ (approximately)}.$$

Therefore, it follows that the change in resistance between the two FET drains is approximately zero:

$$\Delta R_{D1D2} = 0.$$

This result corresponds to complete distortion cancellation under the indicated approximations. This result shows that for serially connected (e.g. source-to-source) FETs, the change in resistance between the FET pair Q1-Q2 drain terminals under these conditions is zero. The small signal shown in FIG. 3, corresponding to the RF signal in mixer circuit 10, passes through the FET channel combination Q1 and Q2 without controlling the overall resistance of the FET-pair channel combination. This condition is equivalent to infinite intermodulation suppression and helps reduce intermodulation distortion in mixer 10. Under actual operating conditions, where the assumed conditions may not hold entirely true, the distortion is reduced to a level.

In reference to FIG. 2, which shows a preferred embodiment of the mixer, the LO input circuit 12 comprises inductor L1 106, and capacitor C1 107. A dc block capacitor C2 108 may also be provided between the input circuit 12 and the gate terminals of FETS Q1 and Q2. Inductors L1 106 and capacitor C1 107 are connected in parallel with each other and with the external local oscillator source 16 at LO input port 13. LO source 16 generates a sinusoidal signal at the desired local oscillator frequency. Capacitor C2 108 is serially connected between the local oscillator port 13 pin terminal 14 and the common gate terminals of the FET-pair (Q1-Q2) 102, 103.

The LO input circuit 12 pumps the FET-pair switch in response to the LO signal and turns Q1 and Q2 ON (conducting) during one-half of the LO cycle and OFF (nonconducting) during the other-half of the LO signal cycle. Intrinsic gate capacitances of FET transistors Q1 and Q2 ($C_{gQ1}$ and $C_{gQ2}$), which appear effectively as a capacitance between the common gate node and ground, are tuned to an open circuit with inductor L1 106 and capacitor C1 107. Capacitor C2 108 is a dc blocking capacitor which allows the gate pair of FET-pair Q1 and Q2 to self bias at about −2 volts.

The external RF signal source 54 is coupled to mixer 10 through pin terminal 56 and ground terminal 57 of RF port 55 by means of transformer balun T2 110 which is constructed as a transmission line transformer and comprises T2A1 111 and T2A2 112. In the illustrated embodiment, balun T2 110 is constructed to support and propagate frequencies in the range between about 1600 MHz and about 2000 MHz. Balun T2 110 is coupled to the FET-pair (Q1-Q2) through balanced diplexer circuits 40, 41 comprising capacitors C3 114 (10 pF) and C4 115 (10 pF), inductors L2 116 (10 nH) and L3 117 (10 nH), and capacitors C5 118 (10 pF) and C6 119 (10 pF).

Balanced diplexer circuits 40, 41 couple the balun to the switching circuit, and filter the RF and IF signals at a stage at which the RF and IF signals are still balanced. For diplexer circuit 40, the RF pin terminal 56 is connected through T2A1 to the drain terminal of FET Q1 via capacitor C3 114 (10 pF). The FET Q1 drain is also connected to one terminal of a parallel combination of inductor L2 116 (10 nH) and resistor R2 134 (100 ohm). The second terminal of the parallel combination is connected to the common source terminals of FETs Q1 and Q2 through capacitor C5 and to T1A1 121 which is flux coupled to T1A2, which in turn is electrically connected to IF pin terminal 66.

In analogous manner for diplexer circuit 41, the RF ground terminal 57 is connected through T2A2 to the drain terminal of Q2 via capacitor C4 115 (10 pF). The Q2 drain is also connected to one terminal of a parallel combination of inductor L3 117 (10 nH) and resistor R3 134 (100 ohm). The second terminal of the parallel combination of L3 and R3 is connected to the common source terminals of FETs Q1 and Q2 through capacitor C6 (10 pF) and to T1B2 124 which is flux coupled to T1B1. T1B1 in turn, is electrically connected to IF ground terminal 67. Current flow through T1A1 and T1B2 induces a signal into T1A2 and T1B1 which appears at the IF output port 65. Each diplexer 40, 41 filters the RF from the IF signal (when operating as a frequency down-convertor), or the IF from the RF (when operating as a frequency up-convertor).

The external IF signal sink or load 64 is coupled to mixer 10 through pin terminal 66 and ground terminal 67 of IF port 65 by means of balun T1 120 and comprises balun portions T1A1 121 and T1A2 122, and T1B1 123 and T1B2 124. Balun T1 120 is constructed as a transmission line transformer but acts functionally as a lumped element transformer. In the illustrated embodiment of FIG. 2, it supports and propagates frequencies in the range between about 10 MHz and about 300 MHz. Balun T1 120 is also coupled to the FET-pair (Q1-Q2) through balanced diplexer circuits 40, 41. Baluns T2 110 and T1 120 also prevent LO frequency signals that appear at the FET-pair drains from coupling through to RF port 55 or IF port 65. Each balun T1 and T2 supports a different range of non-overlapping RF and IF frequencies.

Figure 4:
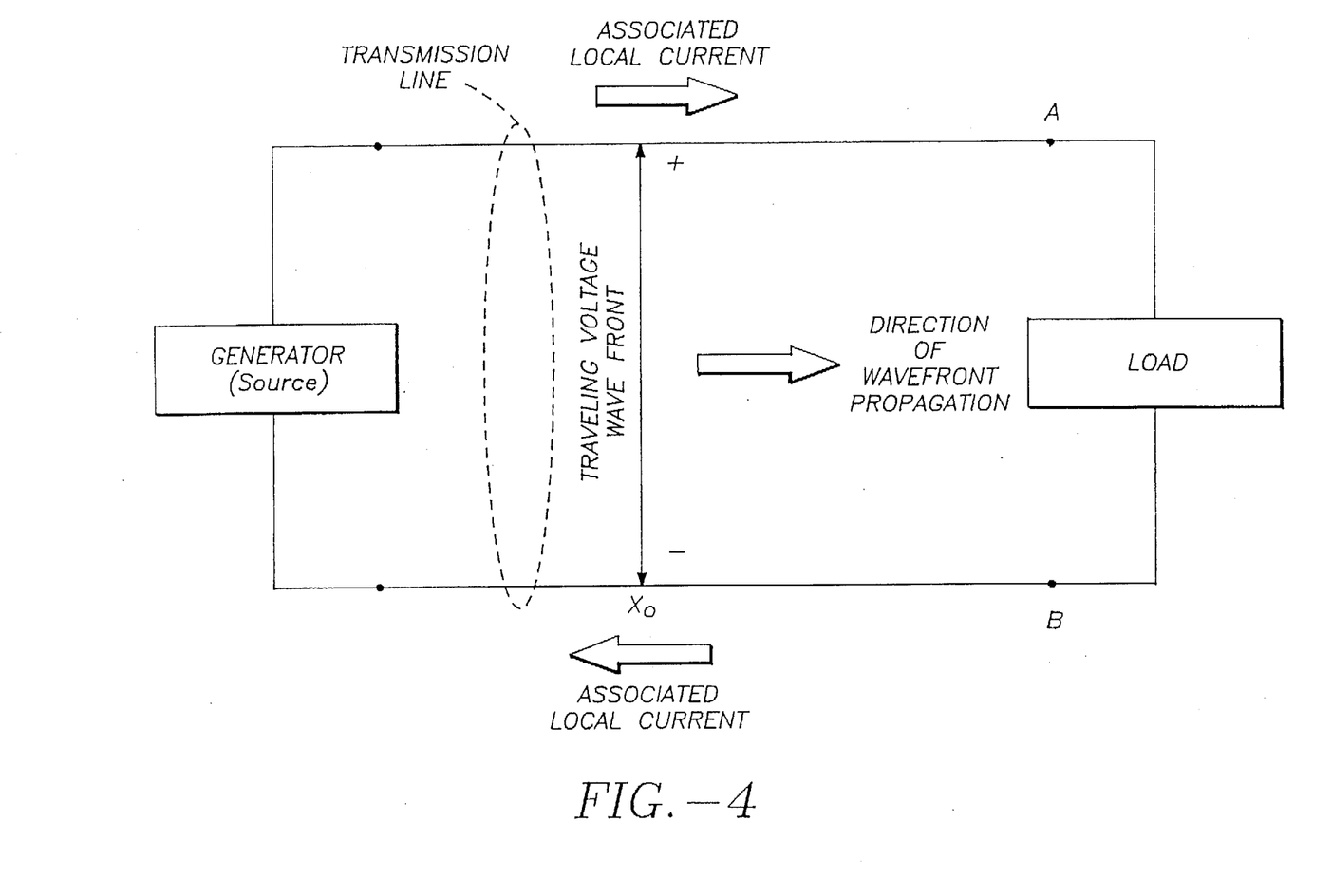
FIG. 4 is a schematic of a propagation of a wavefront in a transmission line.

In a transmission line, the energy in a wave travels in a single direction (before reflection), in this case from left to right as shown in FIG. 4. Upon reflection, it courses back on itself. We can say that the reflected wave travels from right to left as shown in FIG. 4. Associated with the wave, there are local values of voltage and current. A voltage appears at any position $X_0$ as a potential difference across the line. Also, a pair of associated local currents (a local current pair) pair exists in the line at $X_0$, where the local currents flow in complementary directions, as shown. When the incident wavefront reaches the load, the wave is partially reflected, resulting in both forward and reflected traveling waves at the load. It is the local current pairs of the forward and reflected waves that flow through the load.

It is therefore ultimately clearer to describe circuit operation by referring to the entire balanced circuit action as a whole. In this context, for a balanced signal that passes simultaneously through both diplexers, the traveling voltage wave reflects from the FETs due to impedance mismatch between the transmission line (≈50Ω) and the FETS ($Z_{FETS, ON}$≈8Ω, $Z_{FETS, OFF}$ 1000Ω). When the FETS are conducting the FET impedance is much less than the line impedance ($Z_{FETS}$<<50Ω) and when the FETS are not conducting, their impedance is much greater that the line impedance ($Z_{FETS}$>>50Ω). The current associated with the local wavefronts of both the incident and reflected waves must flow through $Q_1$ and $Q_2$, since they form current pairs flowing into the load (e.g. at node A) and out of the load (e.g. at node B); hence they flow through the load.

Figure 5:
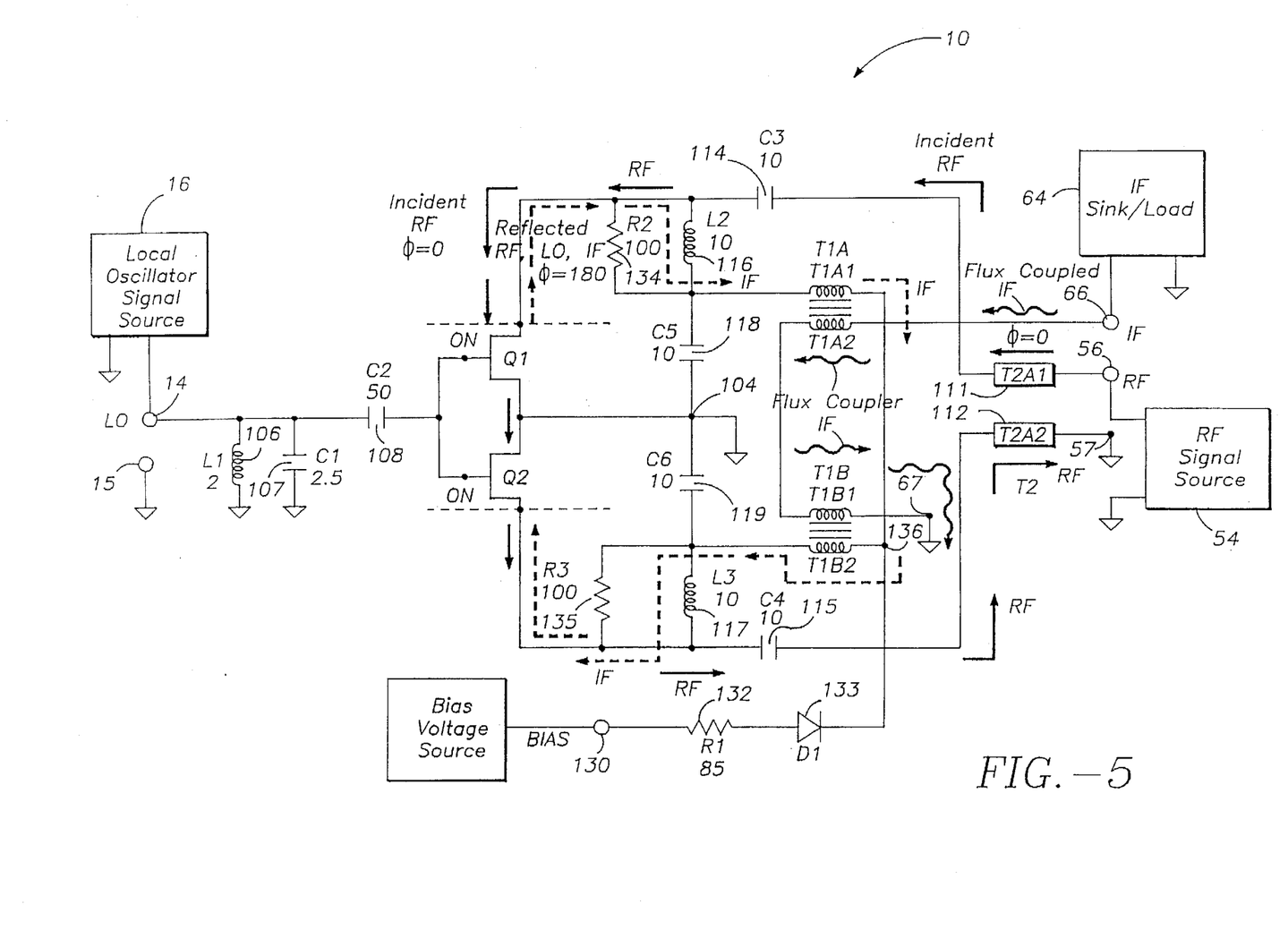
FIG. 5 is a schematic diagram of the embodiment of the invention in FIG. 2 showing the flow of current in the RF and IF baluns of the mixer when FETs Q1 and Q2 are conducting (ON) for one-half of an RF signal cycle.

The manner of the coupling of the RF and IF signals to the FET-pair switch are now described with reference to FIGS. 5 and 6 relative to operation as a frequency down-converter wherein the input signal is an RF signal in the frequency range between about 1600 MHz and about 2000 MHz, the IF output signal is in the frequency range between about 10 MHz and about 400 MHz, and the LO signal is about a 4.5 Vp-p sinusoid at about 2000 MHz, but a sinusoid in the range between about 1600 MHz and about 2000 MHz may be used.

When the RF signal arrives at Q1 and Q2 it mixes with the local oscillator signal (e.g. at 2000 MHz) and produces signals at the sum and difference frequencies (IF=RF±LO). For an RF center frequency of 1600 MHz and a LO signal frequency of 2000 MHz, the IF signal is centered at 200 MHz. Therefore, the RF, and IF signal frequencies do not overlap. The inventive mixer has a restricted range of IF frequencies and the usable IF and RF frequency bands may be broadly separated. The LO and RF frequencies may overlap; but the RF and IF frequencies should not.

Figure 6:
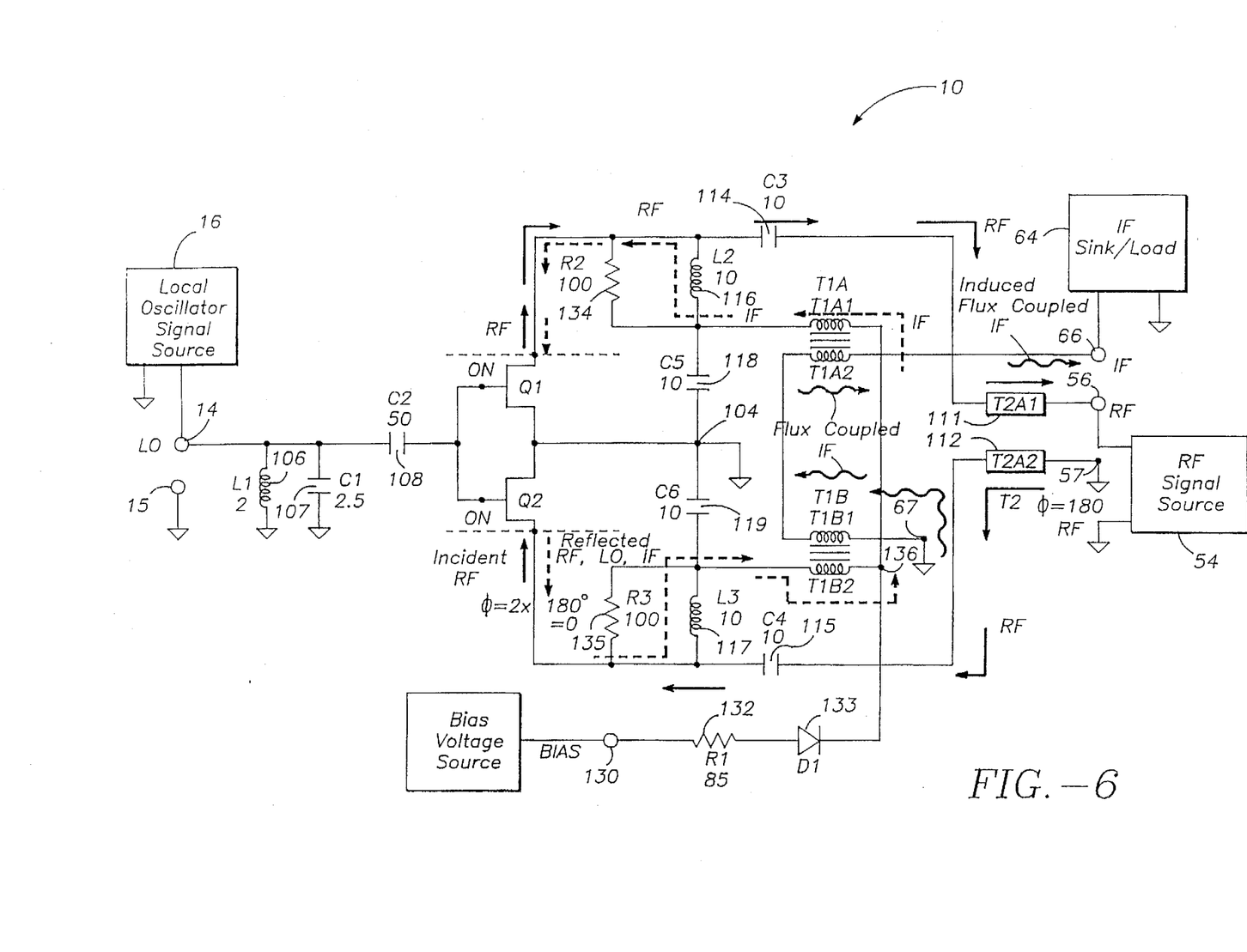
FIG. 6 is a schematic diagram of the embodiment of the invention in FIG. 2 showing the flow of current in the RF and IF baluns of the mixer when FETs Q1 and Q2 are conducting (ON) for the opposite half-cycle of the RF signal to that shown in FIG. 5.

With reference to FIG. 6, an RF signal is introduced from external RF source 54 at RF pin terminal 56 and propagates from the RF port into and through balun component T2A1111 to diplexer circuit 40. Diplexer 40 is constructed and tuned such that capacitor C3 (10 pF) passes the RF frequencies to the drain terminal of FET Q1. Q1 and Q2 are turned on and off by the LO signal at the LO signal frequency. When the RF signal encounters the Q1 drain it mixes with the LO signal and sees an impedance mismatch owing to either the much lower FET impedance (about 2–8 ohms) during the FET conduction (ON) cycle or the much higher impedance (greater than about 500 ohms) during the non-conducting (OFF) cycle. Each impedance mismatch results in some RF signal reflection.

The reflected signal has a 180-degree phase shift when the propagating wave encounters a lower impedance (e.g. encounters a conducting FET). The reflected signal, now mixed with the LO signal at the FET Q1 drain and including RF, LO, and IF=RF±LO signal components back reflects through diplexer 40 to transformer T1A1 121 and T1B2 124.

The current in T1A1 and T1B2 induces a current at the IF frequency in flux-coupled transformer T1A2 122 and T1B1 123 respectively which appears at the IF port 65 pin and ground terminals 66, 67. The IF current in T1B2 continues to flow through the parallel combination of resistor R3 135 and L3 117 of diplexer 41 and into the drain of FET Q2 to complete the current loop with the reflected signal from FET Q1 as described. Resistors R2 and R3 provide the bias source with the proper impedance.

The propagation of the RF signal from the RF ground terminal 57 (this signal is 180 degrees out of phase relative to the signal applied at RF pin terminal 56) is now described with reference to FIG. 6. The RF signal propagates from the RF port into and through transmission line balun T2A2 112 to diplexer circuit 41. Diplexer 41 is constructed and tuned such that capacitor C4 (10 pF) passes the RF frequencies to the drain terminal of FET Q2. When the RF signal encounters the Q2 drain it mixes with the LO signal and sees an impedance mismatch owing to either the much lower FET impedance (about 2–5 ohms) during the FET conduction (ON) cycle or the much higher impedance (greater than 500 ohms) during the non-conducting (OFF) cycle, and the impedance mismatch results in some RF signal reflection. The reflected signal has a 180-degree phase shift when the propagating wave encounters a lower impedance (e.g. encounters a conducting FET), but undergoes no phase reversal when it encounters a higher impedance. The reflected signal, now mixed with the LO signal at the FET Q2 drain and including RF, LO, and IF=RF±LO signal components back reflects through diplexer 41 to flux-coupled transformer T1B2 124 and T1A1 121. The current in T1B2 and T1A1 induces a current at the IF frequency in flux-coupled transformer T1B1 123 and T1A2 122 respectively which appears at the IF port 65 pin and ground terminal 66, 67. The IF current in T1A1 continues to flow through the parallel combination of resistor R2 134 and L2 116 of diplexer 40 and into the drain of FET Q1 to complete the current loop with the reflected signal from FET Q2 as described.

Figure 7:
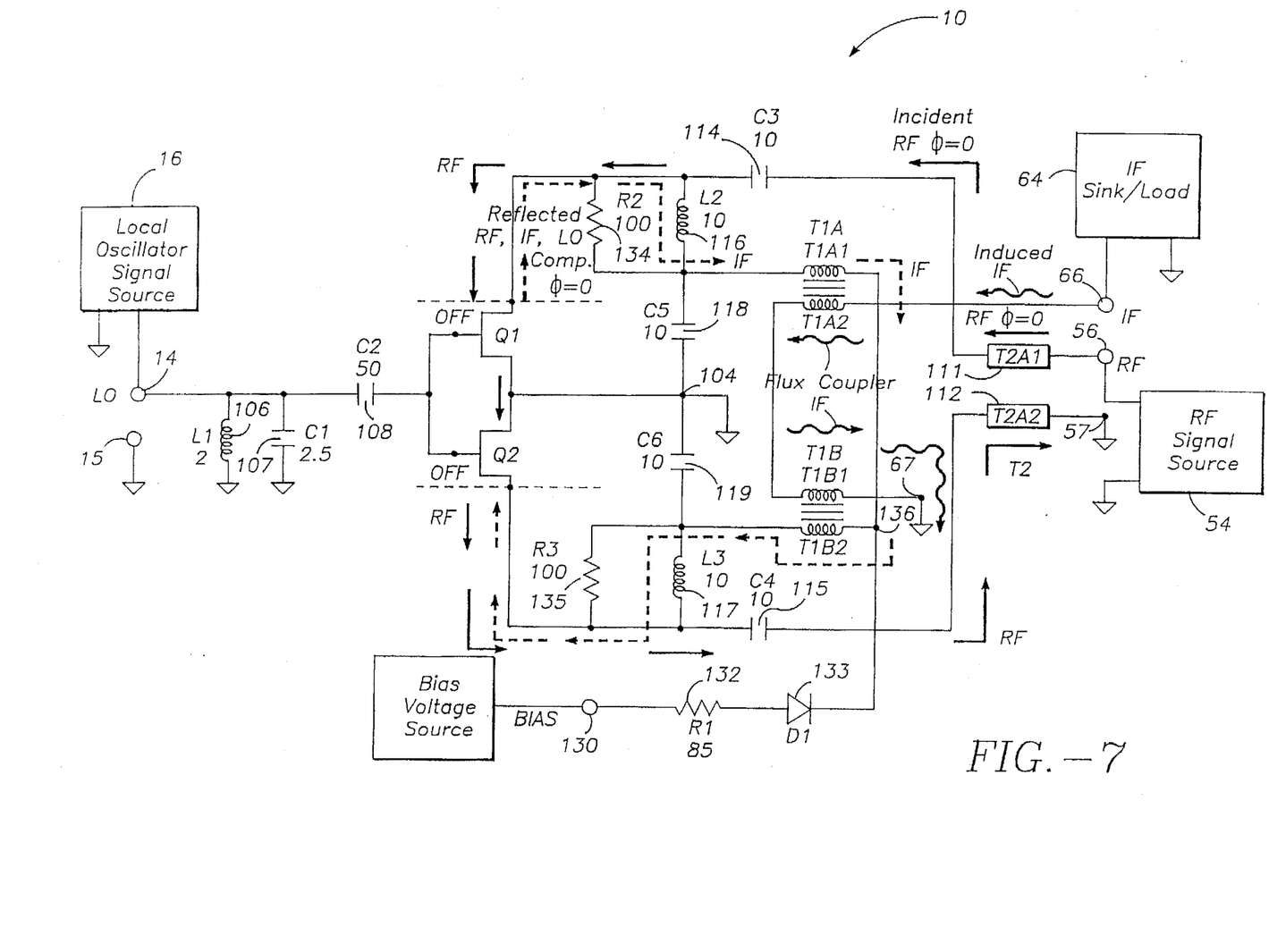
FIG. 7 is a schematic diagram of the embodiment of the invention in FIG. 2 showing the flow of current in the RF and IF baluns of the mixer when FETs Q1 and Q2 are conducting (OFF) for one-half of an RF signal cycle.
Figure 8:
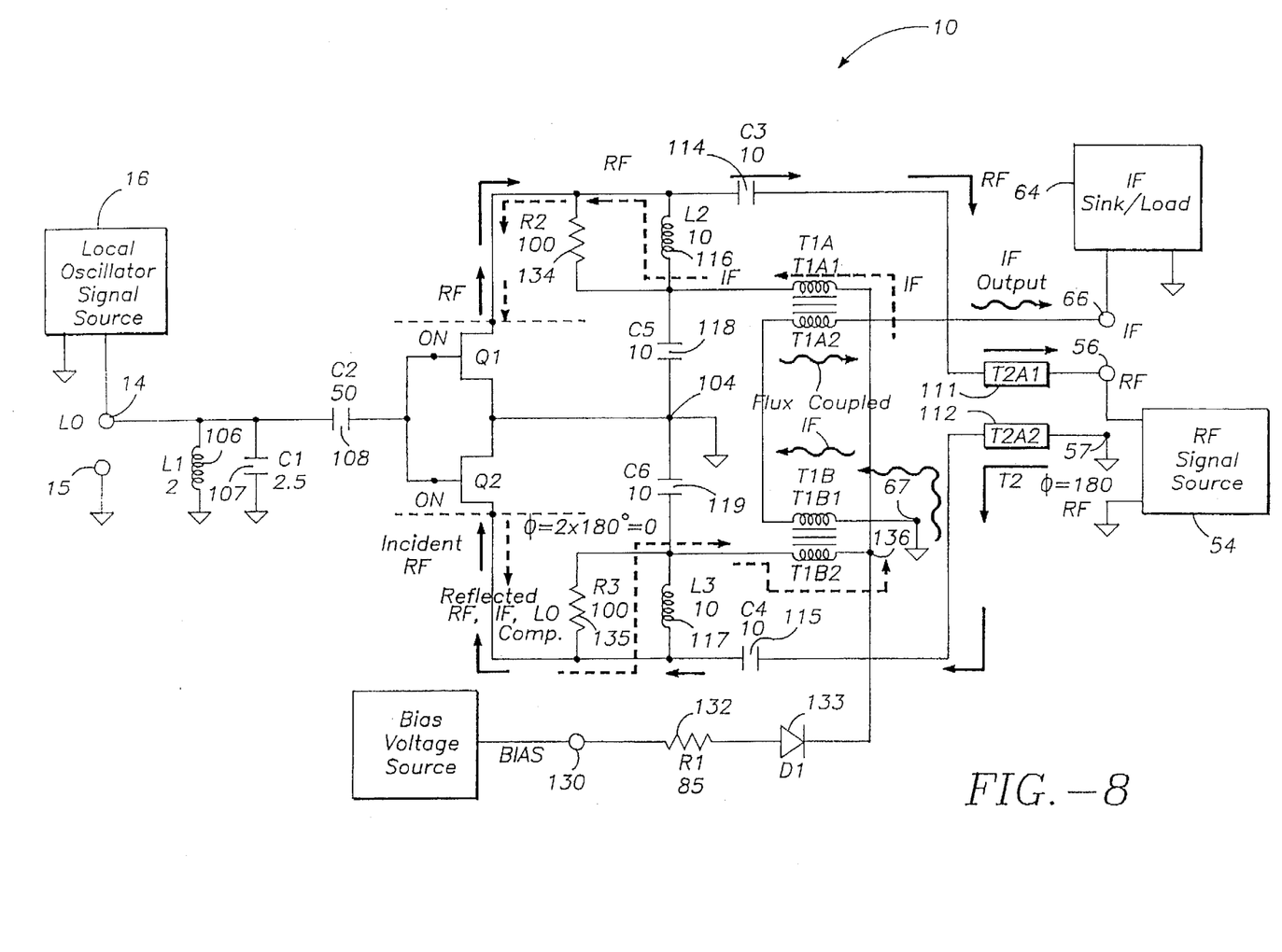
FIG. 8 is a schematic diagram of the embodiment of the invention in FIG. 2 showing the flow of current in the RF and IF baluns of the mixer when FETs Q1 and Q2 are conducting (OFF) for the opposite half-cycle of the RF signal to that shown in FIG. 7.

Signal propagation when FETs Q1 and Q2 are OFF is now described with respect to FIGS. 7 and 8. In reference to FIG. 7, an RF signal entering mixer 10 from the RF pin terminal 56 propagates in the same manner as described with respect to FIG. 5A, except that because the non-conducting FET has a higher impedance than the diplexer or balun, the wave incident on Q1 or on Q2 does not undergo a 180 degree phase shift at FET Q1 or Q2 and the back reflected wave at the IF port is in-phase with the externally applied RF signal at the RF pin terminal 56 and the RF ground terminal 57 respectively. Similarly, in reference to FIG. 8, propagation of the RF signal from RF ground terminal 57 when FETs Q1 and Q2 are OFF is analogous to that described with respect to FIG. 6, except that's because the non-conductivity FETs have a higher impedance than the duplexor balun, the incident wave does not undesign a 180 degree phase reversal at Q1 or Q2.

The diplexers prevent RF frequencies from propagating to the IF port, and the baluns prevent LO signals from propagating to the IF and RF ports thereby insuring good LO-to-IF, RF-to-IF, and LO-to-RF isolation. Inductors L2 116 and L3 117 in the diplexer circuits 40, 41 also serve the additional function of resonating out the intrinsic drain capacitances of the FETs and thereby improve the FET performance as switching elements.

Balun T1 120 (T1A and T1B) functions as a flux-coupled or lumped-element transformer even though in the illustrated embodiment, T1 is fabricated in the manner of a transmission line transformer. It functions as a lumped element transformer because the IF port is limited to a band of frequencies over which the transformer behaves as a lumped element transfer, while a characteristic of transmission line transformers is that the length of line in the transmission line transformer is always appreciable compared to a wavelength of the excitation in the line. Here, the frequencies of interest are in the range between about 10 MHZ and about 300 MHZ, so that the length of the transmission line is not appreciable compared to the excitation wavelength. On the other hand, balun T2 110 functions as a transmission line transformer. Although balun T1 is fabricated as a transmission line transformer in this embodiment, it may alternatively be fabricated as a lumped element transformer.

In the inventive mixer circuit 10, balun T 1120 also supports the drain bias function by providing a dc path from circuit node 136 where drain bias is applied to the FET drains via diplexers 40, 41, as well as allowing the LO signal waveforms on the drains of Q1 and Q2 to feed symmetrically into T1 in such a way as to cancel at IF port 66 so as to provide LO-to-IF isolation.

Mixer 10 is a reflection mixer in the sense that incident energy reflects from FETs Q1 and Q2 and travels in reversed direction back through the balun T1 120 to IF port 65; however, even though circuit operation relies on back reflection of the RF energy, balun T1 is not a reflection transformer. One characteristic of a reflection transformer is that it is a transmission line transformer that relies on a nearly complete reflection of energy at some reference plane of the transformer to achieve substantially complete coupling between two or more distinct terminals or ports. The inventive mixer does not use a reflection transformer because the transformer is a lumped element transformer rather than a transmission line transformer, and does not rely on nearly complete reflection of energy at any reference plane of the transformer to couple the RF and IF terminals as required of a true reflection transformer. More pointedly, if the transformer were to be a reflection transformer, both RF and IF ports would necessarily belong to this same transformer. A characteristic of reflection transformers is that energy flows in two opposite directions during normal operation, and further that each direction of energy flow plays an equally necessary role in achieving coupling between its parts. The inventive mixer is a passive reflection mixer that uses FETs as switching elements.

The diplex filtering in diplexers 40, 41 takes place at the inputs and outputs (reflection) of the FETs at a level in which the circuit and signals are still balanced. For this reason, the baluns that perform the function of converting the balanced signals to unbalanced signals are separate because the signals are already separated at that point and yet they are not unbalanced yet. The provision of separate RF and IF baluns permits operation at a higher frequency and with greater band separation between the RF and IF bands than could easily be accomplished by a single balun simultaneously. Each balun T1 and T2 is preferably and advantageously fabricated to handle their respective desired signal frequency ranges.

Those workers having ordinary skill in the art, in light of the description contained herein, will realize that all of the afore-described currents propagate through the balun and/or FETs simultaneously (depending on the conduction states of the FET pair) and that is piecewise description is made for the purpose of enhancing understanding of the mixer operation. Those having ordinary skill in the art in light of the description contained herein will further realize that mixer circuit 10 may also be used for frequency up-conversion by applying an intermediate frequency signal to IF port 65 and extracting an up-converted RF signal at RF port 55. The RF and IF frequency bands may be distinct and non-overlapping. RF to IF isolation is provided when the two frequency bands do not overlap.

Although this invention has been described in terms of the presently preferred embodiments, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A mixer comprising:

a first and a second FET transistor each having a gate and a drain and a source, the first and second FET transistors having their gates tied to one another and said sources connected together such that the first and second FET transistors are in series;

a local oscillator (LO) input circuit having an unbalanced input port for connecting to an external local oscillator signal source, and an output port for connection to said gates and sources of the first and second FET transistors such that the first and second FET transistors are driven on and off in response to said externally applied LO signal;

a first diplexer circuit having a primary port coupled between said first FET transistor drain and source terminals and a secondary port having first and second secondary port terminals, said first diplexer comprising the combination of a first inductor serially connected to a first capacitor in parallel with said primary port and a second capacitor serially connected between said first diplexer primary port and said first diplexer secondary port;

a second diplexer circuit having a primary port coupled between said second FET transistor drain and source terminals and secondary port having third and fourth secondary port terminals, said second diplexer comprising the combination of a second inductor serially connected to a third capacitor in parallel with said primary port and a fourth capacitor serially connected between said second diplexer primary port and said second diplexer secondary port;

an RF and IF coupling network comprising a flux-coupled IF transformer and a transmission line RF balun;

said flux-coupled IF transformer having two pairs of flux-coupleable windings and a center tap between said two pairs of windings, and further having a first port connected to said second and third terminals of said secondary ports of said first and second diplexer circuits respectively, and a second port connected to a two-terminal IF port;

said transmission line RF balun having first and second terminals of a primary port and second and third terminals of a secondary port, said first terminal serially connected to said first capacitor, said second terminal connected to said second capacitor, said third terminal connected to a first RF port terminal, and said fourth terminal connected to a second RF port terminal; and a bias circuit coupleable to an external bias source for providing a direct current (dc) bias to the drains of said first and second FET transistors coupled to said center tap and comprising first and second resistors each connected in parallel with said first and second resistors; whereby a dc circuit path is defined between said bias source, said two transformer windings, said first and second resistors, and said FET transistor drain terminals, and said FET transistor source terminals.

2. The mixer in claim 1, wherein said RF transmission line balun transformer having a system impedance of $Z_0$ comprises first and second transmission line segments having a transmission line characteristic impedance of $Z_0$ and coupled to said RF port and being coupled to said drains of said FET transistors through said diplexer circuits.

3. The mixer of claim 1, wherein said RF transmission line balun comprises bifilar windings on a ferrite core.

4. The mixer of claim 1, wherein said RF transmission line balun has a characteristic impedances of approximately 50 ohms.

5. The mixer of claim 1, further comprising a ceramic substrate and ceramic cover in which substantially all of the components of the mixer are encased.

6. The mixer of claim 1, further comprising an alumina ceramic substrate subjacent first FET, and said second FET, said first resistor, and said second resistor.

7. The mixer of claim 6, wherein said first and second FET transistors comprise a GaAs MESFET MMIC device mounted to the alumina substrate.

8. The mixer of claim 1, further comprising a local oscillator input circuit including the parallel combination of an inductor and a capacitor.

9. The mixer of claim 8, further comprising a diode in said bias circuit for bias circuit protection.

10. The mixer of claim 1, wherein said mixer operates in the frequency range between 1700 MHz and 2000 MHZ.

11. A mixer comprising:

a first and a second FET transistor each having a gate and a drain and a source, the first and second FET transistors having their gates tied to one another and said sources connected together such that the first and second FET transistors are in series;

an input port for receiving an external local oscillator signal and for connecting said local oscillator signal to said gates and sources of the first and second FET transistors such that the first and second FET transistors are driven on and off in response to said externally applied LO signal;

a first diplexer circuit having a primary port coupled between said first FET transistor drain and source terminals and a secondary port having first and second secondary port terminals, a second diplexer circuit having a primary port coupled between said second FET transistor drain and source terminals and secondary port having third and fourth secondary port terminals, and an RF and IF coupling network comprising a flux-coupled IF transformer and a transmission line RF balun.

12. The mixer in claim 11, wherein said input port is an unbalanced input port.

13. The mixer in claim 11, wherein said said first diplexer comprising the combination of a first inductor serially connected to a first capacitor in parallel with said primary port and a second capacitor serially connected between said first diplexer primary port and said first diplexer secondary port; and said second diplexer comprising the combination of a second inductor serially connected to a third capacitor in parallel with said primary port and a fourth capacitor serially connected between said second diplexer primary port and said second diplexer secondary port.

14. The mixer in claim 13, wherein said flux-coupled IF transformer having two pairs of flux-coupleable windings and a center tap between said two pairs of windings, and further having a first port connected to said second and third terminals of said secondary ports of said first and second diplexer circuits respectively, and a second port connected to a two-terminal IF port; and said transmission line RF balun having first and second terminals of a primary port and second and third terminals of a secondary port, said first terminal serially connected to said first capacitor, said second terminal connected to said second capacitor, said third terminal connected to a first RF port terminal, and said fourth terminal connected to a second RF port terminal.

15. The mixer in claim 14, further comprising a bias circuit coupleable to an external bias source for providing a direct current (dc) bias to the drains of said first and second FET transistors coupled to said center tap and comprising first and second resistors each connected in parallel with said first and second resistors; whereby a dc circuit path is defined between said bias source, said two transformer windings, said first and second resistors, and said FET transistor drain terminals, and said FET transistor source terminals.

16. The mixer in claim 14, wherein said RF transmission line balun transformer having a system impedance of $Z_0$ comprises first and second transmission line segments having a transmission line characteristic impedance of $Z_0$ and coupled to said RF port and being coupled to said drains of said FET transistors through said diplexer circuits.

17. The mixer of claim 16, wherein said RF transmission line balun comprises bifilar windings on a ferrite core.

18. The mixer of claim 15, wherein said RF transmission line balun has a characteristic impedances of approximately 50 ohms.

19. The mixer of claim 11, wherein said first and second FET transistors comprise a GaAs MESFET MMIC device mounted to the alumina substrate.

20. The mixer of claim 11, wherein said mixer operates in the frequency range between 1700 MHz and 2000 MHZ.

* * * * *